US008115486B2

(12) United States Patent
Habara et al.

(10) Patent No.: US 8,115,486 B2
(45) Date of Patent: Feb. 14, 2012

(54) MAGNETIC RESONANCE IMAGING APPARATUS AND RADIO FREQUENCY PULSE WAVEFORM GENERATING METHOD

(75) Inventors: Hideta Habara, Musashino (JP); Yoshitaka Bito, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 106 days.

(21) Appl. No.: 12/260,612

(22) Filed: Oct. 29, 2008

(65) Prior Publication Data
US 2009/0108842 A1 Apr. 30, 2009

(30) Foreign Application Priority Data

Oct. 30, 2007 (JP) ................................. 2007-281531

(51) Int. Cl.
*G01V 3/00* (2006.01)
*A61B 5/055* (2006.01)
*G06K 9/00* (2006.01)

(52) U.S. Cl. ........ 324/318; 324/307; 324/309; 600/410; 600/416; 382/128; 382/131

(58) Field of Classification Search .......... 324/300–322; 382/128–131; 600/410, 411, 416, 523–525; 345/419; 395/700
See application file for complete search history.

(56) References Cited

U.S. PATENT DOCUMENTS

| | | | | |
|---|---|---|---|---|
| 4,760,336 | A | | 7/1988 | Conolly ........................ 324/309 |
| 4,812,760 | A | * | 3/1989 | Bottomley et al. ........... 324/309 |
| 4,908,578 | A | * | 3/1990 | Van Liere ..................... 324/309 |
| 4,952,877 | A | * | 8/1990 | Stormont et al. ............. 324/312 |
| 5,212,448 | A | * | 5/1993 | Le Roux et al. .............. 324/309 |
| 5,226,418 | A | * | 7/1993 | Bernstein et al. ............. 600/419 |
| 5,361,763 | A | * | 11/1994 | Kao et al. ..................... 600/410 |
| 6,801,037 | B1 | * | 10/2004 | Zhang ........................... 324/309 |
| 6,937,015 | B2 | * | 8/2005 | Heid ............................. 324/307 |
| 7,075,302 | B2 | * | 7/2006 | Zhu ............................... 324/318 |
| 7,081,750 | B1 | * | 7/2006 | Zhang ........................... 324/309 |
| 7,787,678 | B2 | * | 8/2010 | Unal et al. .................... 382/128 |
| 7,864,999 | B2 | * | 1/2011 | Chang et al. .................. 382/128 |
| 2005/0134268 | A1 | * | 6/2005 | Zhu ............................... 324/309 |
| 2007/0110290 | A1 | * | 5/2007 | Chang et al. .................. 382/128 |
| 2009/0108842 | A1 | * | 4/2009 | Habara et al. ................. 324/307 |
| 2010/0325185 | A1 | * | 12/2010 | Balchandani et al. ........ 708/403 |

OTHER PUBLICATIONS

David I. Hoult, et al, "Sensitivity and Power Deposition in a High-Field Imaging Experiment", Journal of Magnetic Resonance Imaging, 12: 46-47, 2000.
Chun-yu Yip, et al, "Interactive RF Pulse Design for Multidimensional, Small-Tip Angle Selective Excitation",Magnetic Resonance in Medicine, 54: 908-917, 2005.
U. Katscher et al. "RF Shimming Using a Multi-Element Transmit System in Phantom and in Vivo Studies", Proc. Intl. Soc. Mag. Reson. Med. 15, p. 1693, 2007.

* cited by examiner

*Primary Examiner* — Melissa Koval
*Assistant Examiner* — Tiffany Fetzner
(74) *Attorney, Agent, or Firm* — Mattingly & Malur, PC

(57) ABSTRACT

An MRI apparatus comprises a waveform controlling means for calculating a radio frequency pulse and applying the pulse to an irradiating means, and the waveform controlling means reads out a radio frequency pulse waveform vector from a first memory means which memorizes multiple radio frequency pulse waveform vectors, calculates a simulated irradiation pattern, and calculates a radio frequency pulse waveform which gives the minimum value of weighted sum of squares of differences of absolute values and squares of differences of phases for an ideal irradiation pattern and the simulated irradiation pattern. An RF pulse waveform showing superior ideal irradiation pattern reproducibility and providing reduced power of the RF waveform is formed, and safety of MRI subject is improved by performing imaging using such an RF pulse.

12 Claims, 9 Drawing Sheets

(a)

(b)

If $\sqrt{(x^2+y^2)} < r$, $|m|=1$
If $\sqrt{(x^2+y^2)} > r$, $|m|=0$
$\angle m = 0°$
(r is radius of the cylinder)

(a)

(b)

(a)

(b)

(a)

(b)

MAGNETIC RESONANCE IMAGING APPARATUS AND RADIO FREQUENCY PULSE WAVEFORM GENERATING METHOD

CLAIM OF PRIORITY

The present application claims priority from Japanese patent application JP 2007-281531 filed on Oct. 30, 2007, the content of which is hereby incorporated by reference into this application.

TECHNICAL FIELD

The present invention relates to a magnetic resonance imaging apparatus (henceforth referred to as MRI apparatus), and the present invention relates especially to a method for calculating a radio frequency pulse waveform for exciting a test subject.

BACKGROUND ART

An MRI apparatus generates images of a test subject by placing the test subject in a uniform static magnetic field generated by a magnet to irradiate electro magnetic waves to the test subject and excite nuclear spins in the test subject, and then receiving nuclear magnetic resonance signals as electromagnetic waves generated by the nuclear spins to visualize the test subject. The irradiation of the electromagnetic waves and reception of the nuclear magnetic resonance signals are performed with an RF coil which transmits and receives electromagnetic waves of radio frequency (RF).

In recent years, the static magnetic field intensity of MRI apparatuses has been increasing to 3 tesla or more. As a result, frequency of the radio frequency pulse to be irradiated to a subject is also increasing to 128 MHz or more. If the frequency of electromagnetic waves to be radiated becomes higher, its wavelength becomes shortened to a size comparable to the size of human body. As a result, in propagation of electromagnetic waves in human bodies, wave characteristics become significant, and specifically, inhomogeneity is generated in images obtained by MRI apparatuses.

In MRI apparatuses utilizing a magnetic field of 3 tesla, which have spread over many hospitals in the past several years, for example, problem of inhomogeneity of image brightness becomes significant, which is not so problematic in MRI apparatuses of 1.5 tesla conventionally used. The problem of brightness inhomogeneity becomes more serious especially when abdominal part of human body is imaged.

It has been attempted to solve the problem of image brightness inhomogeneity due to inhomogeneity of irradiated RF waves in MRI apparatuses using an ultrahigh magnetic field (3 tesla or more) by preliminarily determining an irradiation pattern (also called an excitation pattern or excitation profile) for correcting the inhomogeneity and reproducing the preliminarily determined irradiation pattern upon imaging. As techniques for reproducing a predetermined irradiation pattern, there are (1) a method called "RF shimming" (for example, Non-patent document 1: Journal of Magnetic Resonance Imaging, 12:46-67 (2000)), (2) a method called "multi-dimensional RF pulse" (for example, Non-patent document 2: Magnetic Resonance in Medicine, 54:908-917 (2005)), and so forth.

The RF shimming is a method of reproducing an irradiation pattern by using multiple coils and changing phases and magnitudes of RF waveforms applied to the coils. The multi-dimensional RF pulse method is a technique of multi-dimensional selective excitation by simultaneous irradiation of a gradient magnetic field and RF waves, in which an optimized RF waveform is obtained by calculation. This method is used not only for correcting homogeneity of irradiation pattern, but also for exciting a part of subject.

Ultrahigh magnetic field MRI apparatuses using a magnetic field of 3 tesla or more also have a problem of increase in SAR (specific absorption rate) due to the use of RF electromagnetic waves in addition to the problem of brightness inhomogeneity. When electromagnetic waves are irradiated on a human body, a part of the energy thereof may be absorbed as heat to elevate body temperature. Degree of such absorption is evaluated with a numerical value of SAR. In ultrahigh magnetic field MRI apparatuses using a magnetic field of 3 tesla or more, SAR increases compared with, for example, that observed with MRI apparatuses using a magnetic field of 1.5 tesla, even if imaging is performed under the same condition. Therefore, there is a problem that an imaging sequence safely usable with a magnetic field of 1.5 tesla may not be used with a magnetic field of 3 tesla.

In the multi-dimensional RF pulse method, since the gradient magnetic field applied simultaneously with RF pulse draws a trajectory covering a wide range of wave number space, period of irradiating the RF pulse becomes longer. Moreover, in order to correctly reproduce the irradiation pattern, it is necessary to superimpose a moiety where electromagnetic waves are weakened by the gradient magnetic field and a moiety where electromagnetic waves are strengthened by the gradient magnetic field, and therefore the method has a problem of increase of SAR in principle.

Several techniques for reducing SAR have also been developed so far. An example is the VERSE (variable-rate selective excitation) method (Patent document 1: U.S. Pat. No. 4,760,336).

It has been so far attempted to apply the VERSE method to the multi-dimensional RF pulse method described above. However, such attempt has problems that (1) calculation of RF waveform and gradient magnetic field waveform becomes complicated, (2) since period of pulse irradiation becomes longer, error of irradiation pattern increases, and so forth.

Meanwhile, since an irradiation pattern is generally described with complex number for each sampling space element, a complex number for each point has an absolute value component and a phase component. In the method described in Non-patent document 3 (Proc. Intl. Soc. Mag. Reson. Med., 15, p 1693 (2007)), it is attempted to take only the absolute values of a correcting irradiation pattern into consideration, and use "arbitrary" values from 0 to 360 degrees for the phase components. In this method, since there is no restriction for the phase portion at all, the solution which should be calculated in minimization becomes unstable, and therefore the method has a serious drawback that a special method is required for calculation. Moreover, an RF waveform, which makes excited spin phase change rapidly along with the space sampling points, may be generated. When phase change is extremely large, phase change in one pixel may become too large to be ignored, and the pixel intensity represented as the sum may also be reduced.

DISCLOSURE OF THE INVENTION

An object of the present invention is to correctly reproduce a predetermined irradiation pattern and reduce SAR in an MRI apparatus and thereby provide an MRI apparatus which can provide an image with less brightness inhomogeneity at a low SAR. Another object of the present invention is to provide a method for generating RF pulse waveform which makes it possible to obtain a radio frequency pulse (henceforth referred to as RF pulse) waveform showing a reduced SAR compared with that obtainable by conventional methods in processes of reproducing a correcting irradiation pattern with a calculated RF pulse waveform.

According to the present invention, the aforementioned objects are achieved by, when the RF pulse waveform is optimized and applied, determining the RF pulse waveform so that weighted sum of squares of differences of absolute values and those of phases of irradiation patterns, which are a result of radiation of the RF pulse and ideal irradiation pattern, should be minimized. More specifically, an optimal RF pulse waveform is determined by using the following equation (1).

$$\min_{x} \left\{ \begin{array}{l} \lambda \sum_{i} \{|m_i| - |f_i(x)|\}^2 + \\ \chi \sum_{i} \{\angle m_i - \angle\{f_i(x)\}\}^2 + (1 - \lambda - \chi)\|x\|_2^2 \end{array} \right\} \Lambda \quad (1)$$

In the equation, $m_i$ and $f_i(x)$ are elements of irradiation pattern vectors m and f(x) in space sampling dimension, and $\lambda$, $\chi$ and $(1-\lambda-\chi)$ are weight parameters for absolute value, phase, and magnitude of RF waveform (intensity), respectively.

The magnetic resonance imaging apparatus of the present invention thus comprises an irradiating means for irradiating a magnetic field pulse comprising a gradient magnetic field and a radio frequency pulse on a test subject, a waveform controlling means for calculating a radio frequency pulse waveform for realizing an ideal irradiation pattern and applying a radio frequency pulse of the calculated waveform to the irradiating means, and an imaging means for processing nuclear magnetic resonance signals generated by the test subject after irradiation of the magnetic field pulse to perform imaging, and is characterized in that the waveform controlling means comprises a first memory means which memorizes multiple radio frequency pulse waveform vectors, and a calculating means for reading out the radio frequency pulse waveform vectors from the memory means to calculate a simulated irradiation pattern and calculating a radio frequency pulse waveform which gives a minimum weighted sum of squares of differences of absolute values and squares of differences of phase values between the ideal irradiation pattern and the simulated irradiation pattern.

In a preferred embodiment of the magnetic resonance imaging apparatus of the present invention, the waveform controlling means comprises a third memory means which memorizes matrix information determined by sensitivity map of the radio frequency coil and sweeping pattern of the gradient magnetic field, and the simulated irradiation patterns are calculated by using the matrix information read out from the third memory means and the radio frequency pulse waveform vectors.

If a phase term of irradiation pattern is incorporated into the equation for minimization and imaging is performed by using the RF pulse, an RF waveform giving a less SAR than that obtainable by conventional methods can be obtained. This make it possible to use more various kinds of imaging methods compared with a case using conventional techniques even in an MRI apparatus using a magnetic field of 3 tesla or more which suffers from the problem of increase in SAR.

Figure 1:
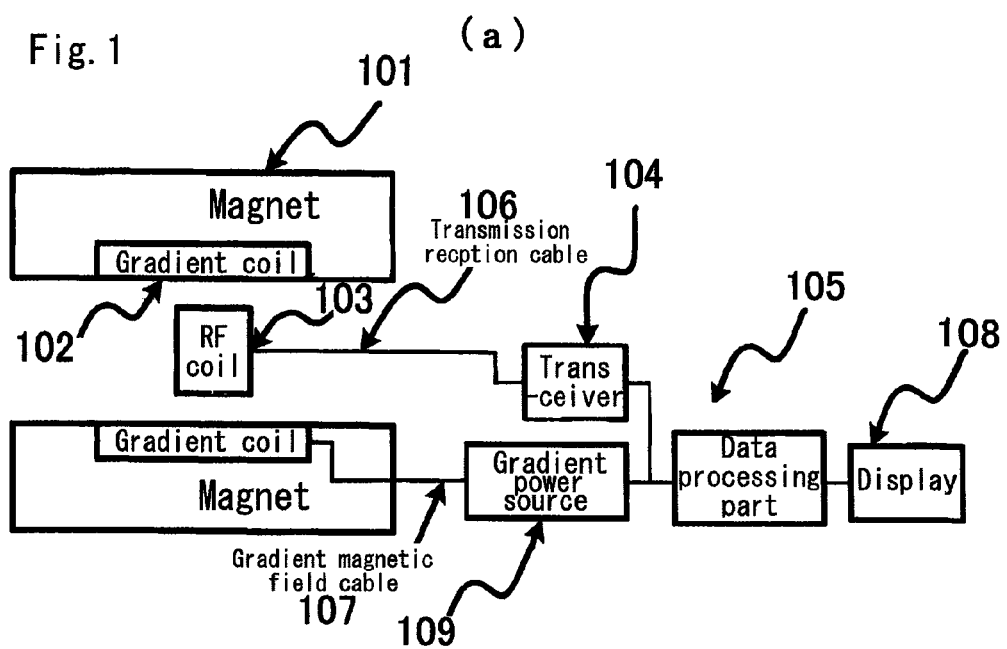
FIG. 1 (a) is a drawing showing an embodiment of the MRI apparatus to which the present invention is applied, and (b) is a block diagram showing details of data processing part.
Figure 1:
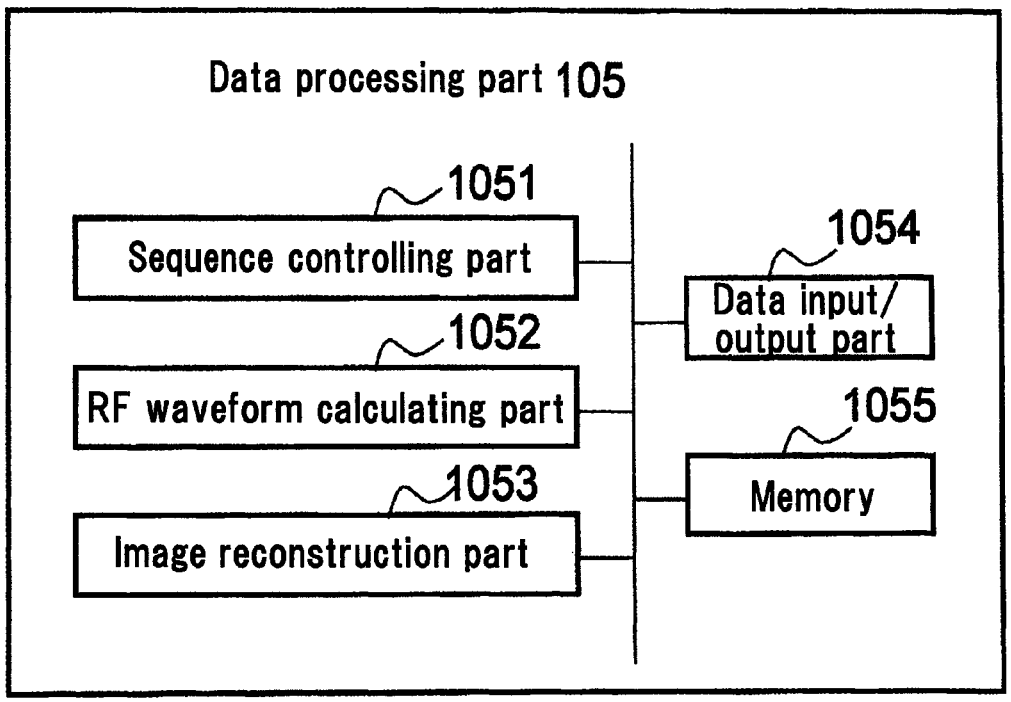

In the drawings, 101 represents a static magnetic field magnet, 102 represents a gradient magnetic field coil, 103 represents an RF coil, 104 represents a transceiver, 105 represents a data processing part/operating part, 108 represents a display, 109 represents a power source for gradient magnetic field, 1051 represents a sequence controlling part, 1052 represents a RF waveform calculating part, 1053 represents a image reconstruction part, 1054 represents a data input/output part, and 1055 represents a memory.

BEST MODE FOR CARRYING OUT THE INVENTION

Hereafter, embodiments of the present invention will be explained with reference to the drawings.

Embodiments of the MRI apparatus of the present invention will be explained first. FIG. 1, (a) shows outline of an MRI apparatus to which the present invention is applied.

This MRI apparatus is constituted by a magnet 101 for applying a static magnetic field to a subject, a gradient magnetic field coil 102 for giving magnetic field gradient along a predetermined direction to the static magnetic field, an RF coil 103 for transmitting electromagnetic waves such as radio frequency waves to the subject and receiving electromagnetic waves, which is inserted into the magnet 101, a transceiver 104 for producing and transmitting electromagnetic waves to be irradiated from the RF coil as well as detecting nuclear magnetic resonance signals transmitted from the RF coil and processing them, which is connected to the RF coil 103, a power source for gradient magnetic field 109 for supplying electric current to the gradient magnetic field coil 102, a data processing part 105 for controlling driving of the transceiver 104 and the power source for gradient magnetic field 109, performing various information processing and receiving operation performed by an operator, and a display 108 for displaying results of processing performed by the data processing part 105.

The power source for gradient magnetic field 109 and the gradient magnetic field coil 102 are connected with a gradient magnetic field control cable 107. Further, the RF coil 103 and the transceiver 104 are connected with a cable for controlling the coil and a transmission and reception cable 106. The transceiver 104 is constituted by a synthesizer, a power amplifier, a receiving mixer, an analogue to digital converter, a transmit/receive switch, and so forth, although they are not shown in the drawing.

Although the single RF coil 103 is shown in the drawing as the RF coil for performing irradiation and reception of electromagnetic waves, multiple RF coils, for example, an RF coil for wide range imaging and an RF coil for parts, may be used.

MRI apparatuses are classified into those of horizontal magnetic field type and those of vertical magnetic field type according to the direction of the static magnetic field generated by the magnet 101. In the case of the horizontal magnetic field type, the magnet 101 generally has a cylindrical bore and generates a static magnetic field along the horizontal direction in FIG. 1. In the case of the vertical magnetic field type, a pair of magnets is disposed on both sides over and under the subject, and generate a static magnetic field along the vertical direction in FIG. 1. The present invention can be applied to both types of MRI apparatuses.

The data processing part 105 comprises controls driving of the transceiver 104 and the power source for gradient magnetic field 109 according to a predetermined pulse sequence. By this control, the RF coil 103 and the gradient magnetic field coil 102 irradiate electromagnetic waves (RF) and a gradient magnetic field to the subject, respectively, and the data processing part 105 receives signals generated and emitted by the subject by resonance with the electromagnetic waves, and performs signal processing to create a magnetic resonance image. The pulse sequence may be any of various pulse sequences corresponding to various imaging methods, which are memorized in the data processing part 105 beforehand. In this embodiment, a pulse sequence for simultaneously irradiating a gradient magnetic field pattern for two-dimensionally sweeping the two-dimensional k-space and RF pulse of about several milliseconds to attain multi-dimensional selective excitation is employed as an example.

As the details are shown in FIG. 1, (b), the data processing part 105 comprises a sequence controlling part 1051 for controlling driving of the transceiver 104 and the power source for gradient magnetic field 109, an RF waveform calculating part 1052 for calculating RF waveform to be irradiated from the RF coil 103 to the subject, an image reconstruction part 1053 for reconstructing images using nuclear magnetic resonance signals received by the RF coil 103, a data input/output part 1054 for receiving operation performed by an operator, and a memory 1055 for memorizing parameters required for processing in the sequence controlling part 1051, the RF waveform calculating part 1052 and the image reconstruction part 1053 and information inputted through the data input/output part 1054.

If the imaging sequence is determined, the MRI apparatus of the present invention receives setting of irradiation pattern, calculates an RF waveform for realizing the set irradiation pattern, and performs imaging by using the calculated RF waveform and gradient magnetic field pattern. Although the calculation of the RF waveform may also be performed in a computer independent from the MRI apparatus, it is performed by the data processing part 105 in this embodiment.

Figure 2:
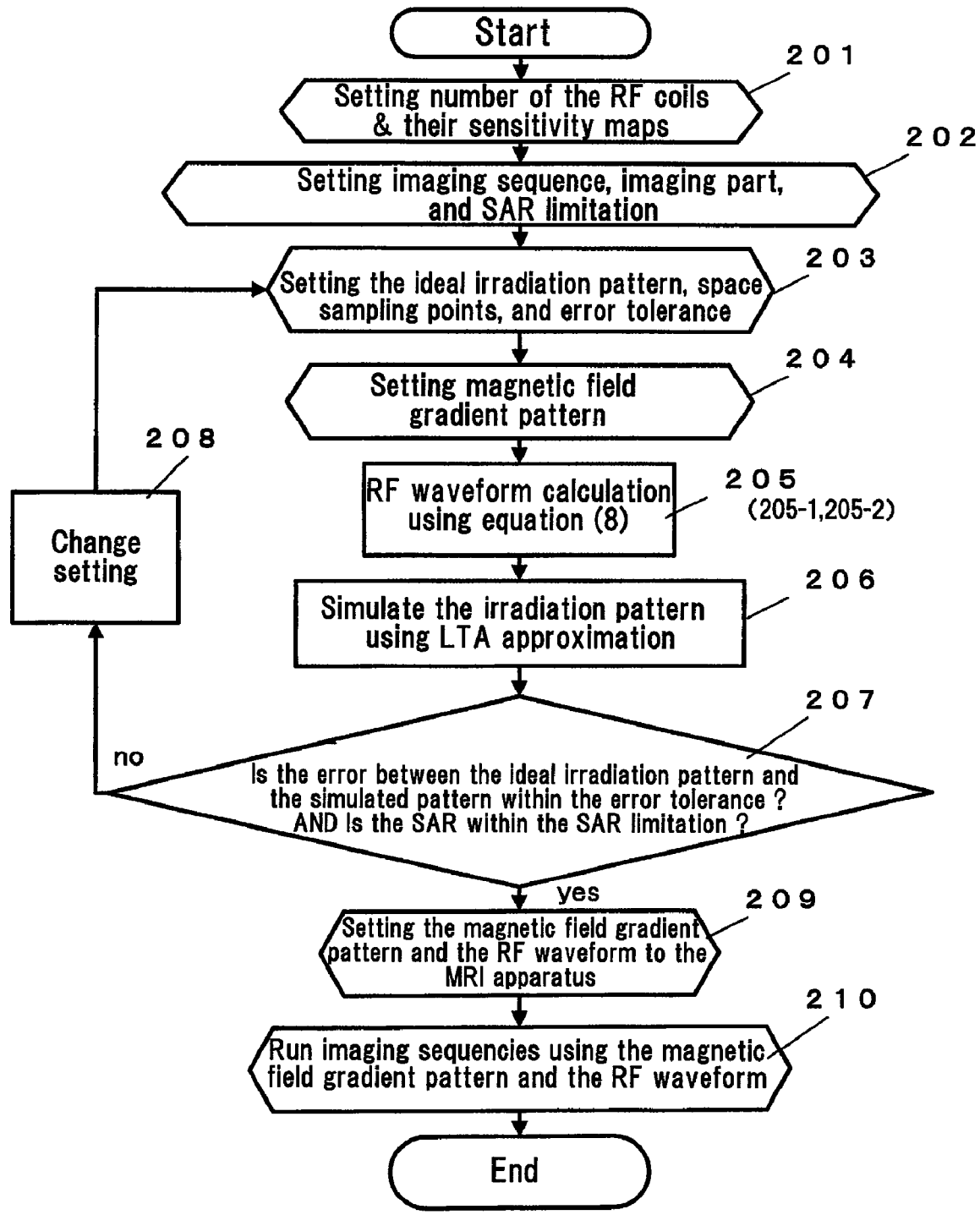
FIG. 2 is a flowchart showing imaging procedure of the MRI apparatus.

Imaging procedure performed by an MRI apparatus having such a configuration as described above will be explained below. FIG. 2 shows a flowchart mainly representing the procedure in the data processing part 105. The imaging procedure roughly consists of the steps of setting a coil, imaging sequence and parameters thereof used for imaging as preparatory steps of imaging (steps 201 and 202), the steps of determining the RF waveform and gradient magnetic field pattern for reproducing an ideal irradiation pattern (203 to 209), and the step of performing imaging by using the determined gradient magnetic field pattern and RF waveform (210). Hereafter, each step will be explained in detail.

First, a coil used for imaging and sensitivity map thereof are determined (step 201). As the sensitivity map, those measured for every coil may be memorized in the memory 1055, or they may be measured by prescanning. The sensitivity map is used for sensitivity correction or calculation for image synthesis for every coil, as well as calculation of the RF waveform.

Figure 3:
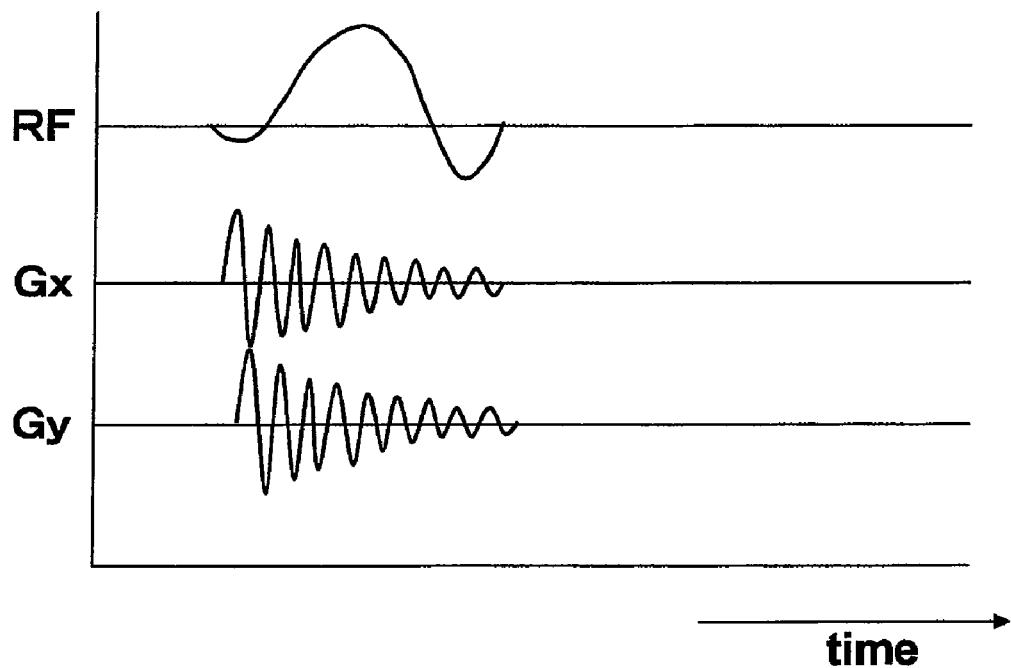
FIG. 3 is a drawing showing an example of imaging sequence (part) employed by the MRI apparatus of the present invention.

Then, setting of imaging sequence, imaging part and SAR limitation are inputted via the data input/output part 1054 (step 202). In this embodiment, the imaging sequence shown in FIG. 3 giving an excitation pattern for simultaneously applying a gradient magnetic field pattern and an RF pulse is used as an example. The SAR limitation is used as a criterion for judging whether intensity of electromagnetic waves irradiated on the subject with the calculated RF waveform is lower than the SAR limitation in the calculation of RF waveform.

Then, setting of irradiation pattern to be realized by the determined imaging sequence is inputted, and at the same time, a spatial sampling number required for calculation of the RF waveform and error tolerance are determined (step 203). These may be inputted beforehand in the data processing part 105 as default values, or they may be changed or inputted by an operator as required. The irradiation pattern is determined to be in a desired shape by an operator on the basis of desired image homogeneity and imaging part. Alternatively, multiple irradiation patterns may be memorized in the memory 1055 beforehand, and a desired one may be chosen and read out.

The irradiation pattern is a complex number defined by a flip angle (absolute value) and phase of nuclear spin, and is a function of space coordinates. If number of spatial sampling points, "q" is determined to define irradiation pattern in a three-dimensional space, the space coordinates, r, are defined as the equation 2:

$$r = [r_1, r_2, \Lambda, r_q]\Lambda \qquad (2)$$

an irradiation pattern m can be represented by the equation (3) with regard to q of defined space coordinates $r_1$ to $r_q$. That is, m is defined as a column vector of q elements.

$$m = [m_1(r_1), m_2(r_2), \Lambda, m_q(r_q)]^T \Lambda \qquad (3)$$

Figure 4:
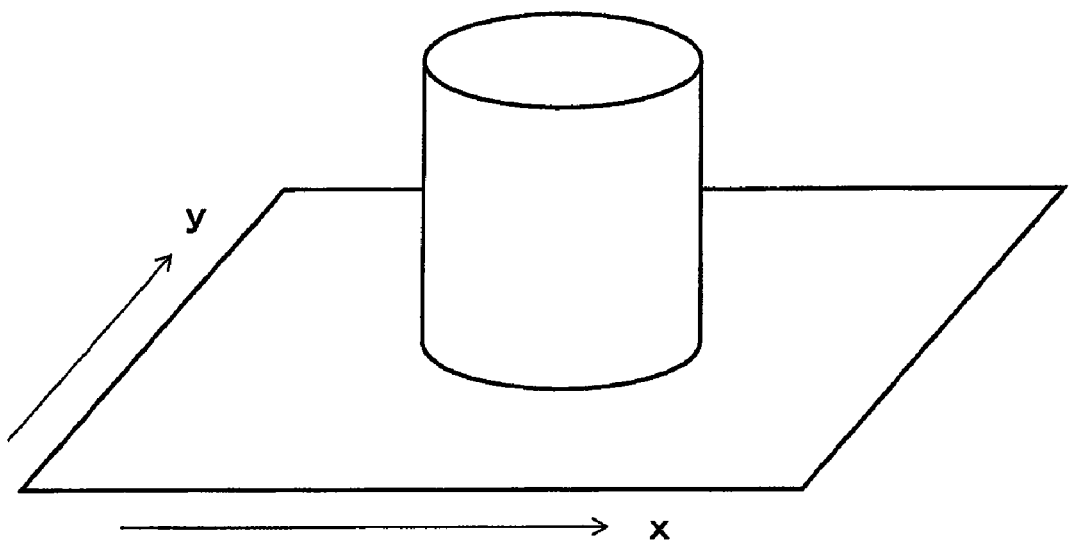
FIG. 4 is a drawing showing an example of ideal irradiation pattern.

An example of the irradiation pattern is shown in FIG. 4. The irradiation pattern m shown in FIG. 4 is an irradiation pattern for uniformly exciting a cylindrical region, and the absolute value |m| and phase ∠m thereof are represented by the following equations.

$|m|=1$ (when $\sqrt{(x^2+y^2)}<1$), or $|m|=0$ (when $\sqrt{(x^2+y^2)}>1$)

∠m=0

Then, a gradient magnetic field pattern simultaneously applied with the RF pulse is determined (step 204). The gradient magnetic field pattern is a waveform of gradient magnetic field intensity along the time axis, and if imaging sequence, imaging part (excitation region), number of coils to be installed and sensitivity maps of the coils are determined, a basic gradient magnetic field pattern will be determined.

By using the gradient magnetic field pattern (Gx, Gy, Gz) and the irradiation pattern m determined in the aforementioned steps, an RF waveform x for reproducing the irradiation pattern m is calculated (step 205). For this purpose, a function f(x) for evaluating the results of excitation using the RF waveform and the gradient magnetic field pattern at the points of the space coordinates r defining the irradiation pattern m is first calculated (step 205-1). The function f(x) is a function of the gradient magnetic field (Gx, Gy, Gz) given simultaneously with the RF pulse waveform x, the space sampling points r, and the sensitivity maps of coils, and is obtained by calculating nuclear spin inclining angles in the static magnetic field (flip angles) observed when the RF pulse and the gradient magnetic field are given at the points r. Information of how much degree the nuclear spin has inclined at the points r in the space relates to brightness as an image quality obtained at the points r.

An RF waveform x determined by the imaging sequence is memorized in the memory 1055 beforehand, and this RF waveform x is read out from the memory 1055 and used as an initial value for calculation of the function f(x).

The RF waveform x is divided into p of time steps in strip shapes, and is represented by the equation (4).

$$x = [x_1(t_1), x_2(t_2), \Lambda, x_p(t_p)]^T \Lambda \qquad (4)$$

The value of x is also a complex number of which elements are defined by intensity and phase of the RF wave. When there are multiple coils which can irradiate RF waveforms, the RF waveforms of them must be distinguished, and they can be defined in the number of coils, like x1, x2, . . . . x1 is represented by the equation (4)' as a representative example.

$$x1 = [x1_1(t_1), x1_2(t_2), \Lambda, x1_p(t_p)]^T \Lambda \qquad (4)'$$

Behavior of nuclear spin in a magnetic field is generally defined by the Bloch equation (equation 5). By solving the equation (5), f(x) can be obtained.

$$\frac{d\vec{M}}{dt} = \gamma \vec{M} \times \vec{B} - \frac{M_x \hat{x} + M_y \hat{y}}{T_2} - \frac{(M_0 - M_z)\hat{z}}{T_1} + D\nabla^2 \vec{M} \; \Lambda \qquad (5)$$

The equation (5) is a differential equation including a term representing rotation of nuclear spin M under the influence of magnetic field B, terms representing relaxation in accordance with the longitudinal relaxation time T1 and the transverse relaxation time T2, respectively, and a term representing the dissipation. The magnetic field B in the equation (5) includes oscillating magnetic field generated by the RF pulse and magnetic field gradient generated by gradient magnetic field.

However, it takes time to strictly simulate the equation (5) on a computer. Therefore, in this embodiment, an approximation method is employed to obtain f(x). As the approximation method, there are known the large tip angle approximation (LTA approximation) and small tip angle approximation in which only the term representing the rotation in the right-hand side of the equation (5) is taken into consideration, and the remainder is disregarded. In this step 205, the small tip angle approximation is applied. The range of the flip angle to which the small tip angle approximation can be applied is a range of from about several degrees to several tens of degrees of flip angle. However, since the small tip angle approximation can provide a solution with a shorter calculation time compared with that required in LTA approximation, it is advantageous in case that calculation must be repeated a large number of times like in step 205.

If the small tip angle approximation is used, f(x) can be represented by multiplication of a sensitivity matrix S of the coils calculated from coil sensitivity, a matrix A calculated from the gradient magnetic field pattern, and a matrix of the RF pulse vector x as shown by the equation (6).

$$f(x) = SAx \; \Lambda \qquad (6)$$

The sensitivity matrix S of the coils is obtained by measuring coil sensitivities at the points r, where the irradiation pattern is set and representing itself as a matrix including only the diagonal elements, and it is represented by the equation (7).

$$S = \text{diag}(s_1(r_1), s_2(r_2), \Lambda, s_q(r_q)) \; \Lambda \qquad (7)$$

When there are multiple coils, sensitivity matrixes in the number of the coils are defined like the RF waveforms, as exemplified by the equation (7)'.

$$S1 = \text{diag}(s1_1(r_1), s1_2(r_2), \Lambda, s1_q(r_q)) \; \Lambda \qquad (7)'$$

Therefore, when there are multiple coils, for example, n pieces of coils, f(x) is described as the equation (6)' using S1, S2, . . . instead of S in the equation (6), and x1, x2, . . . instead of x in the equation (6).

$$f(x) = S1Ax1 + S2Ax2 + \Lambda + SnAxn \; \Lambda \qquad (6)'$$

The matrix A is a matrix consisting of q rows and p columns formed by space position vector r and K-space vector k, respectively, and is represented by the equation (8). The matrix A plays a role of connecting the time sampling number p and the spatial sampling number q.

$$A = i\gamma M_0 \exp(ikr)\Delta t \; \Lambda \qquad (8)$$

The K-space vector k represents K-space coordinates at each time point as shown by the equation (9). The K-space coordinates at each time point k(t) are obtained by time integration of the gradient magnetic field vector g as shown by the equation (10). The gradient magnetic field vector g is a three-dimensional vector comprising the elements of (Gx, Gy, Gz), and is calculated from the gradient magnetic field pattern determined in the step 204.

$$k = [k(t_1), k(t_2), \Lambda, k(t_p)]^T \; \Lambda \qquad (9)$$

$$k(t) = -\gamma \int_t^T g(\tau) d\tau \; \Lambda \qquad (10)$$

As described above, the evaluation function f(x) can be calculated from coil sensitivity, gradient magnetic field pattern and RF waveform by approximation. The f(x) obtained as described above is a vector comprising q elements, like the irradiation pattern m initially defined, and can be represented by the equation (11).

$$f = [f_1, f_2, \Lambda, f_q]^T \; \Lambda \qquad (11)$$

If this f(x) is close to the irradiation pattern m as shown by the equation (12), and error is small, the excitation according to the RF waveform has a profile close to the ideal profile.

$$m \approx f(x) \; \Lambda \qquad (12)$$

In the step 205, an RF waveform x for reproducing an ideal irradiation pattern m is calculated by repetitive operation according to the following equation (1) (step 205-2).

$$\min_{x} \left\{ \begin{array}{l} \lambda \sum_i \{|m_i| - |f_i(x)|\}^2 + \\ \chi \sum_i \{\angle m_i - \angle \{f_i(x)\}\}^2 + (1 - \lambda - \chi)\|x\|_2^2 \end{array} \right\} \Lambda \quad (1)$$

In the equation (1), the first term corresponds to squares of differences of absolute values of irradiation pattern m and f(x), the second term corresponds to squares of differences of phases of irradiation pattern m and f(x), the third term corresponds to magnitude (or intensity, also called norm) of x, and (λ), (χ) and (1−λχ) are parameters which determine the weights of the terms, respectively. The norm is a term for stabilizing the solution x and preventing x from being an unduly large value. It is known that SAR and x are in such a relationship as shown by the equation (13). Therefore, by making weight of the third term relatively large, SAR can be reduced.

$$SAR \propto \|x\|_2^2 \; \Lambda(13)$$

Values of the parameters λ and χ in the equation (1) can be appropriately chosen according to the object of the imaging, restriction of SAR for each sequence, and so forth. For example, when it is desired to lower SAR with ignoring phase error to a certain extent, χ should be preferably about 1/100 to 1/10000 of λ. If χ is larger than 1/100 of λ, sufficient SAR lowering effect cannot be expected. On the other hand, if χ is smaller than 1/10000 of λ, the phase value may significantly deviate in the whole space, or the RF waveform may not be appropriately obtained due to unstable calculation.

In the optimization technique described in Non-patent document 2, in order to calculate an RF waveform x for reproducing an ideal irradiation pattern m, x is optimized so that the value of m−f(x) should be minimized as shown by the equation (14).

$$\min_{x} \{\|m - f(x)\|_2^2 + \beta \|x\|_2^2\} \; \Lambda \quad (14)$$

In the equation (14), β is a parameter for determining which one of the term of m−f(x) and the term of the length of x is weighted.

On the other hand, in the equation (1), sum of the differences of terms of absolute values of m and f(x) and sum of the differences of terms of phases are incorporated into the equation for minimization instead of m−f(x) in the equation (14), and the minimization is performed by putting different weights on the elements of the absolute value and the phase of m−f(x) to reduce the weight put on the phase. As a result, (1−χ−λ) becomes relatively larger, and therefore the third term that contributes to lowering of SAR, i.e., the term of the length of x, can be made small. When the weight put on the phase is reduced, phase error should increase. However, in images obtained by usual MRI, absolute values of obtained data are converted into brightness for evaluation in many cases, while it is rare to construct images from phase portions for evaluation, and phase information of the obtained data may not be necessary in many cases. Therefore, it becomes possible to reduce SAR without affecting images. The value of λ in the equation (1) is preferably a value smaller than 1/(β*β), and corresponding to about $3e^{-3}$, when β is 10 in the equation (14) used in the conventional method. In addition, in imaging positively using phase maps such as susceptibility weighting imaging (SWI), it is also possible to use χ and λ in a relation reverse to that mentioned above.

In the step 205, after an RF waveform x satisfying the equation (1) is calculated, an irradiation pattern obtainable by excitation using that RF waveform and the gradient magnetic field pattern determined in the step 204 is simulated (step 206). This simulation of irradiation pattern is also performed by solving the Bloch equation using approximation, as explained for the calculation of f(x) in the step 205-1. In the step 205, the small flip angle approximation requiring less calculation is used among the small flip angle approximation and LTA approximation, since the calculation is performed many times in that step. However, since one time of calculation is sufficient for the step 206, it is preferable to use LTA approximation giving higher precision.

A irradiation pattern m' obtained by the simulation and the irradiation pattern m set in the step 203 are compared to determine whether the error between them is within the tolerance set in the step 203 and determine whether electromagnetic waves irradiated according to the irradiation pattern m' is lower than the SAR limitation (step 207). The comparison of the irradiation pattern m' and the set irradiation pattern m may be performed, for example, by an operator on the basis of images, or performed on the basis of determination of whether the difference of the absolute values of them is within the tolerance.

When it is determined, as a result, that the error is within the tolerance and electromagnetic waves irradiated according to the irradiation pattern m' is lower than the SAR limitation, the gradient magnetic field pattern and the RF waveform used for the simulation are employed as the imaging conditions, and imaging is performed with those imaging conditions (steps 209 and 210). When either one of the conditions is not satisfied, the conditions including the irradiation pattern, tolerable error, gradient magnetic field pattern, and so forth are changed (step 208), and the steps 203 to 207 are repeated. The step 208 of changing the conditions is performed by, for example, newly inputting the conditions using the data input/output part 1054 by an operator.

As an embodiment of the present invention, the imaging procedure performed by the MRI apparatus is explained above mainly for the calculation of RF waveform performed by the data processing part 105. However, the calculation of RF waveform may also be performed by a computer independent from the MRI apparatus. Further, although this embodiment is explained by exemplifying an imaging sequence for multi-dimensional excitation, the imaging sequence is not limited to such a sequence, and may be arbitrarily chosen. Furthermore, the approximation method used for the calculation of RF waveform can be appropriately changed depending on performance of computer or desired precision.

By using the RF waveform calculation method of the present invention as explained above, weights of the absolute value portion and the phase portion of the irradiation pattern can be changed, and as a result, the power of RF waveform can be reduced without degrading absolute value images. The amount of RF power received by the subject, which poses a problem in ultrahigh magnetic field MRI apparatuses, can be thereby reduced, and safety of the subject can be improved.

Hereafter, examples of the RF waveform simulation according to the present invention will be explained.

Example 1

1. Determination of Preconditions

Supposing excitation of a cylindrical shape having a diameter of 10 cm using a coil having uniform sensitivity profile, such a cylindrical shape having a diameter of 10 cm as shown in FIG. 4 was defined as an ideal irradiation pattern m.

Further, the space sampling vector r in the equation (1) was prepared in such a manner that sampling should be performed at 400 points in a spiral shape winding 10 times within a circular shape having a diameter of 20 cm. The flip angle in the cylinder was set to be 45°. As for the time sampling number of the RF waveform, sampling was performed at 100 points. The trajectory of K-space vector in the equation (9) (gradient magnetic field pattern) was a spiral trajectory winding 10 times from the outside of maximum wave number of 0.3/cm to the inside. A diagonal unit matrix comprising 400× 400 elements was used as the sensitivity matrix S with the premise of using a coil showing uniform sensitivity.

2. Calculation of RF Waveform

With such preconditions, RF waveforms were calculated by using the conventional method (the RF waveform calculation method using the equation (14) described in Patent document 2) and the method of the present invention (the RF waveform calculation method using the equation (1)). The calculation was performed by using three kinds of combinations of the parameters $\lambda$ and $\chi$ in the equation (1).

When the calculation is performed by the conventional method using the small flip angle approximation, the equation (14) can be rewritten as the equation (15).

$$\min_x \{\|m - Ax\|_2^2 + \beta\|x\|_2^2\} \quad \Lambda \qquad (15)$$

As one method for solving the equation (15), a method of using such an inverse matrix as shown by the equation (16) was used, wherein $\beta$ was 10.

$$x=(A^TA+\beta I)^{-1}A^Tm \quad \Lambda \qquad (16)$$

In this calculation, the RF waveform x was standardized as follows. That is, if the RF waveform x was considered a rectangular wave, and the standardization was performed so that the sum of time factors of the waveform in the shape of strip, SUM(x), should be the flip angle (radian). The unit of the irradiation pattern m is radian, which is the same as the unit of the RF waveform x.

3. Evaluation

SARs provided by the RF waveforms x calculated by the conventional method and the method of the present invention were obtained as ratios to that of 180° pulse of rectangular wave and compared. Further, simulation of nuclear magnetization was performed by using the obtained RF waveforms x with LTA approximation, and the flip angles were converted into brightness to obtain images, which were compared with that obtained with the ideal irradiation pattern m. For comparison, an error between absolute value of ideal profile and absolute value of the profile obtained by LTA approximation is expressed using % (normalized root mean square error, NRMSE). Further, since increase of the error of phase portion was in a trade-off relation with decrease of SAR in the present invention, magnitude of error of phase portion was also imaged and compared with that obtained with the conventional method.

The results obtained by the conventional method and the method of the present invention are shown in Table 1.

TABLE 1

| Method, values of parameters | SAR as ratio to that of rectangular 180° pulse having the same time length | Error in absolute value relative to ideal irradiation pattern, NRMSE (%) |
|---|---|---|
| Conventional method, $\beta$ = 10 | 0.190 | 10.3 |
| Invention, combination 1 ($\lambda$, $\chi$) = 1e−2, 1e−5 | 0.155 | 10.5 |
| Invention, combination 2 ($\lambda$, $\chi$) = 6e−3, 1e−6 | 0.137 | 11.2 |
| Invention, combination 3 ($\lambda$, $\chi$) = 3e−3, 3e−6 | 0.109 | 13.9 |

The effect of reducing SAR becomes more significant as the value of $(1-\lambda-\chi)$ becomes closer to 1 for $\lambda$ or $\chi$ in the equation (8). From the results for the combinations 1, 2 and 3 shown in Table 1, it can be seen that the value of SAR decreased from 0.155 to 0.137 and then to 0.109, as the value of $\lambda$ decreased. This was accompanied with increase of the error of the irradiation pattern little by little from 10.5% to 11.2% and then to 13.9%. In the results for the combination 2 according to the present invention, although the error of the irradiation pattern increased compared with the conventional method by about 6.7% from 10.3% to 11.2%, SAR could be lowered even by about 28% from 0.190 to 0.137.

Figure 5:
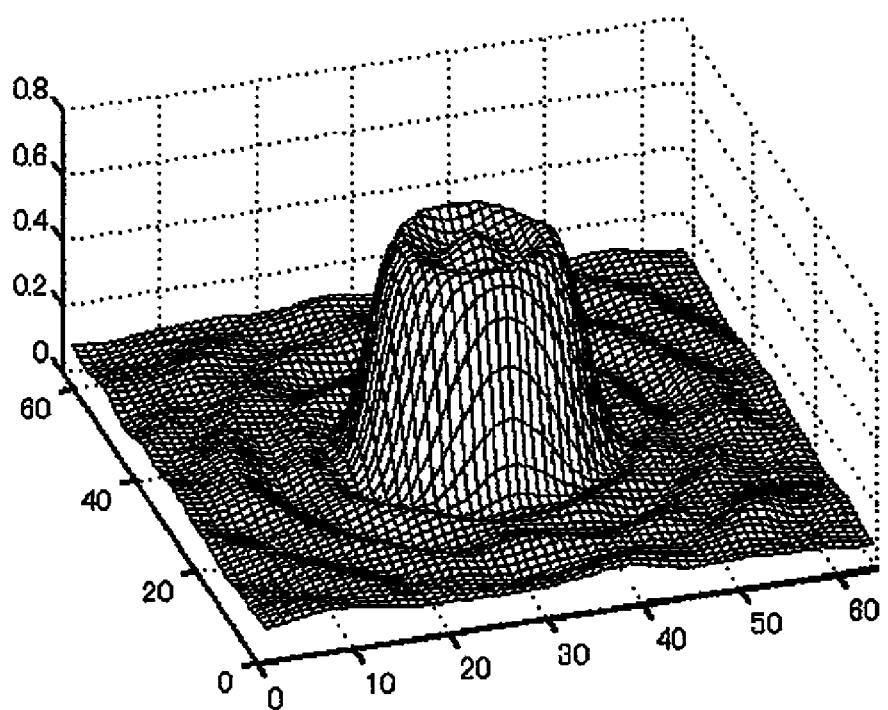
FIG. 5 (a) is a drawing showing absolute value profile of excitation in a shape of one cylinder according to the present invention, and (b) is a drawing showing absolute value profile of excitation in a shape of one cylinder according to the conventional method.
Figure 5:
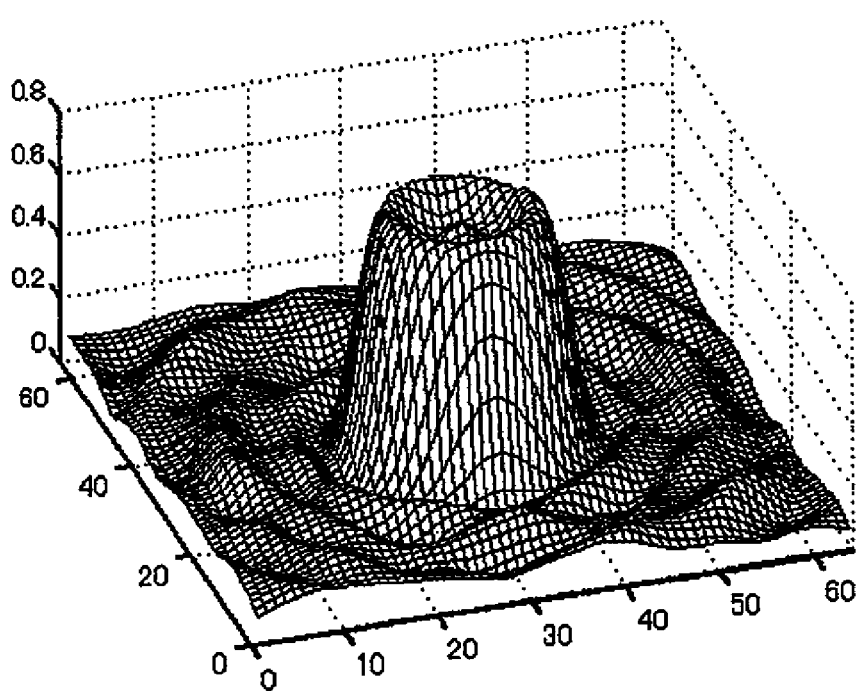

The absolute value of the irradiation pattern according to the present invention (in the case of combination 2) and the absolute value of the irradiation pattern according to the conventional method are shown in FIGS. 5, (a) and (b), respectively. From the results shown in FIGS. 5, (a) and (b), it can be seen that the center portions are excited in a cylindrical shape to a value of about 0.7, and circumference portions show a value of about 0 in both cases. According to the results of the calculation of error of irradiation pattern, the irradiation pattern (b) according to the conventional method should be closer to the ideal profile by about 6.7% compared with the irradiation pattern (a) according to the present invention. However, judging from the images, it can be seen that there is only such a difference that it is difficult to determine which result is superior or inferior to the other.

Figure 6:
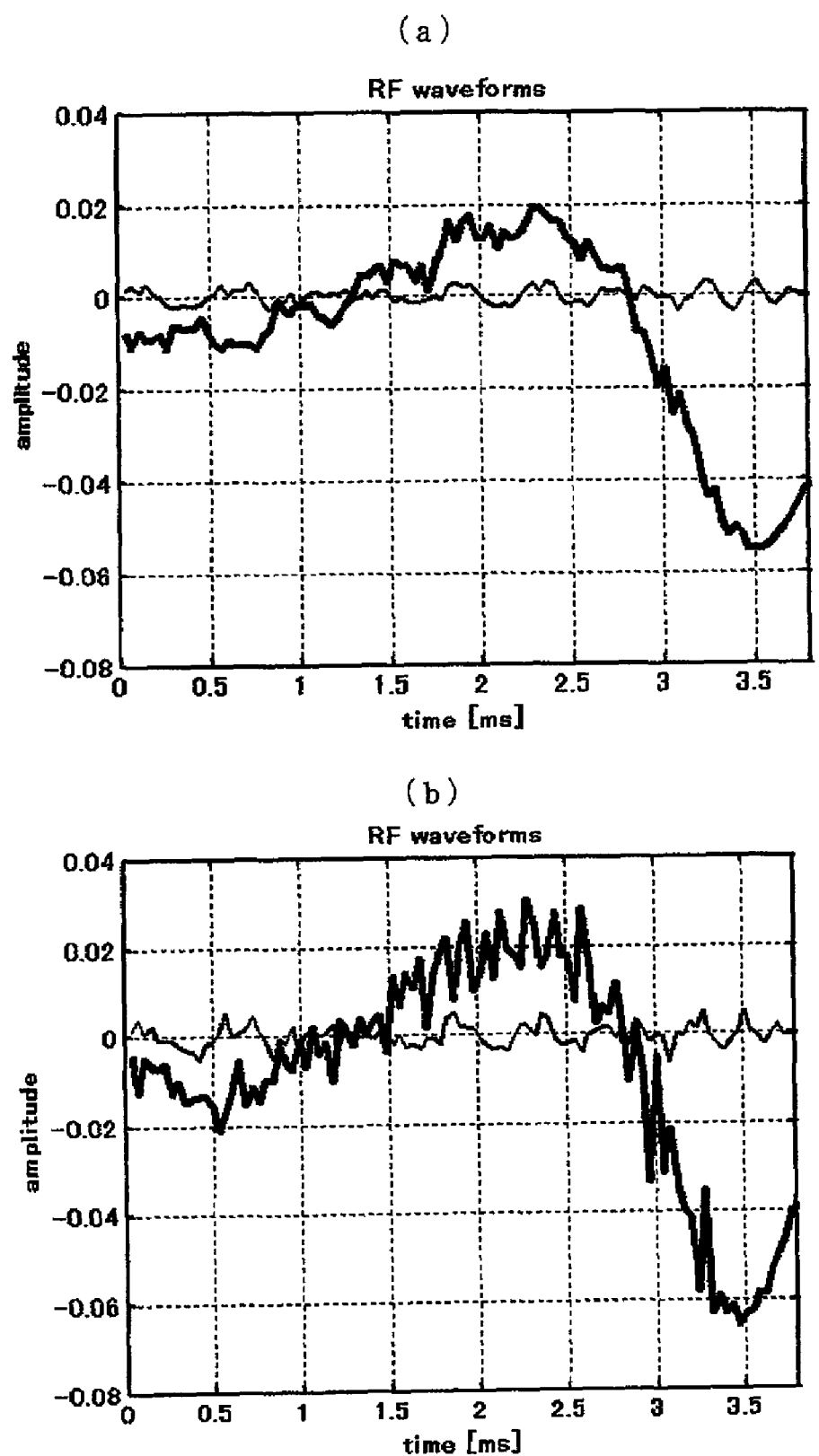
FIG. 6 (a) is an RF waveform for excitation in a shape of one cylinder according to the present invention, and (b) is an RF waveform for excitation in a shape of one cylinder according to the conventional method.

The RF pulse waveform calculated according to the present invention (in the case of the combination 2) and the RF pulse waveform calculated according to the conventional method are shown in FIGS. 6, (a) and (b), respectively. The horizontal axes represent time [ms], and the vertical axes represent magnitude of the standardized RF waveform. The ranges of the vertical axes are the same in FIGS. 6, (a) and (b). In FIG. 6, thick lines represent the real parts of the complex numbers, and the thin lines represent the imaginary parts of the complex numbers.

When the RF waveform of FIG. 6, (a) and the RF waveform of (b) are compared, it can be seen that the magnitude of the RF waveform of (a) is smaller. The value of SAR is proportional to square of absolute value of RF waveform. Thus, the RF waveform of (a) reduced SAR by 28% compared with the RF waveform of (b), and the RF waveform is smaller. As a result, the advantage of decrease in amount of RF power given to a patient subjected to MRI investigation could be confirmed.

Figure 7:
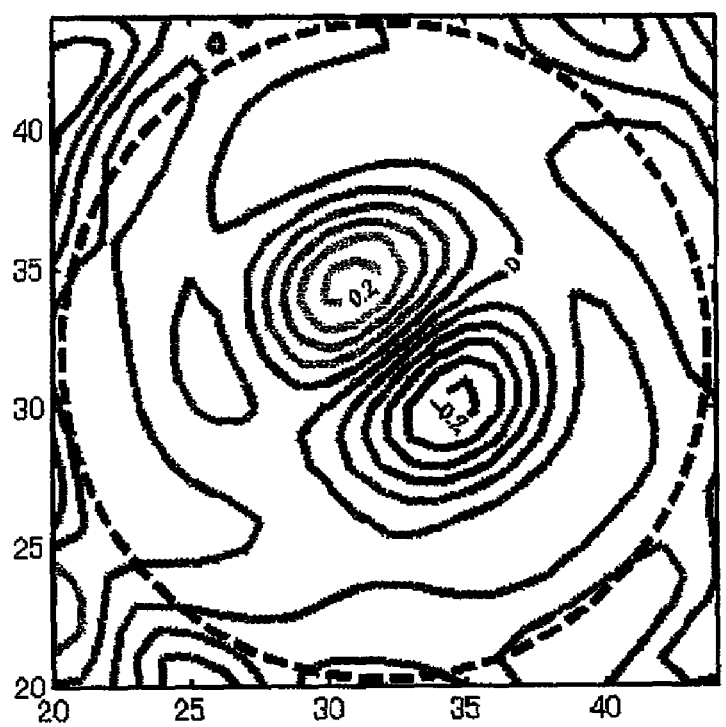
FIG. 7 (a) is a contour map of phase profile for excitation in a shape of one cylinder according to the present invention, and (b) is a contour map of phase profile for excitation in a shape of one cylinder according to the conventional method.
Figure 7:
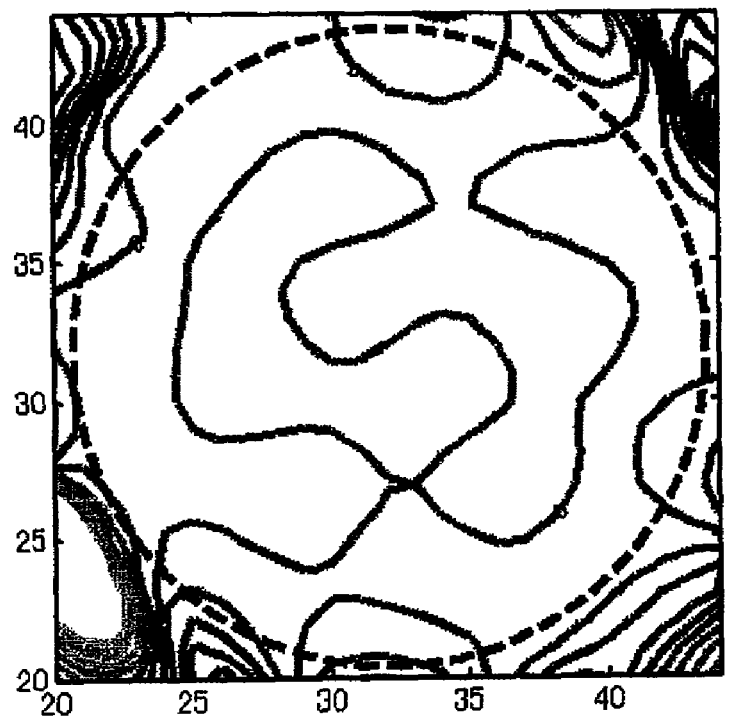

The contour line maps of the phase components of the irradiation patterns according to the present invention (in the case of the combination 2) and the conventional method are shown in FIGS. 7, (a) and (b), respectively. The contour lines are drawn with intervals of 0.04 radian. The circles shown with the broken lines in FIG. 7 represent regions of center portions of the images having a diameter of 10 cm in which flip angle was set to be 45°. As seen from FIG. 7, (b), according to the conventional method, the phase in the cylindrical shape is in the range of 0±0.04 radian. On the other hand, from FIG. 7, (a), it can be seen that the phase shows peaks and valleys of about 0±0.2 radian. However, variation of phases in such a range causes no problem in many cases when an absolute value image is used as an MRI image.

Example 2

1. Preconditions

Figure 8:
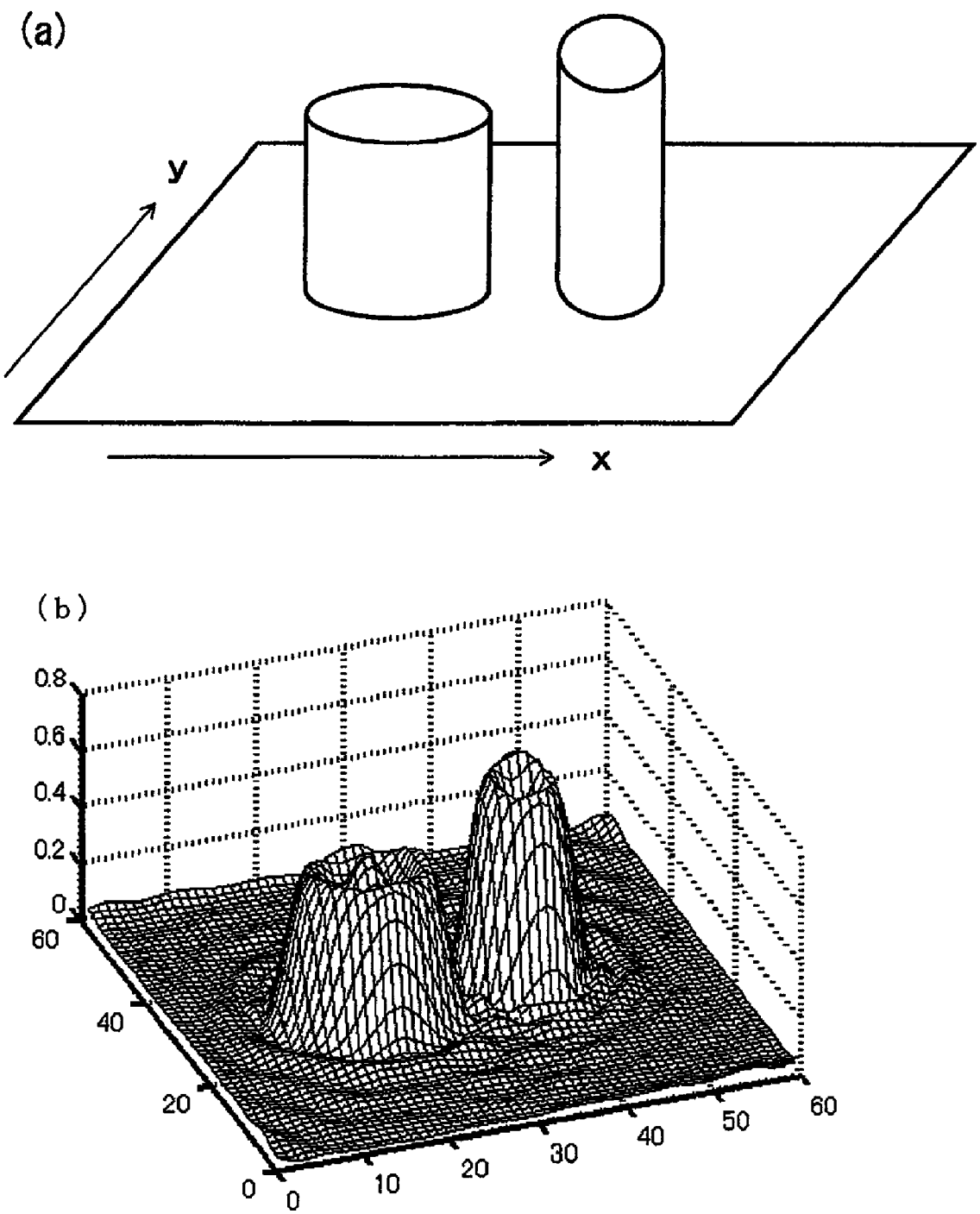
FIG. 8 (a) is a drawing showing an example of ideal irradiation pattern for excitation in a shape of two cylinders, and (b) is a drawing showing an absolute value profile of excitation in a shape of two cylinders according to the present invention.

As an ideal irradiation pattern m, there was used a pattern for exciting such a cylinder having a diameter of 4 cm in which flip angle was 45° and a cylinder having a diameter of 6 cm adjacent to the foregoing cylinder in which flip angle was 30°, total two cylinders, as shown in FIG. 8, (a). The K-space was swept with a gradient magnetic field in a spiral shape winding 10 times, the maximum value of K was 0.5/cm, and sampling was performed at 400 points as time sampling number, and 40×40=1600 points in a square having sides of 20 cm as space sampling number.

2. Calculation of RF Waveform and Evaluation

As in Example 1, RF waveforms were calculated by the conventional method and the method of the present invention, irradiation patterns were calculated from the calculated RF waveforms by using LTA approximation, and errors of the absolute values of the irradiation patterns (%), the values of SAR and phases of the irradiation patterns were compared. In the calculation of the RF waveforms, the value of $\beta$ in the equation (7) used for the conventional method was 10, and the values of $\lambda$ and $\chi$ in the equation (8) used for the method of the present invention were 3e-3 ($10^{-3}$) and 3e-6 ($10^{-6}$), respectively.

The results are shown below. FIG. 8, (b) shows absolute values of the irradiation pattern for two cylinders according to the method of the present invention. Since the flip angle was set to be 45° for the thin cylinder having a diameter of 4 cm, it was excited to a value of about 0.7. It can be seen that since the flip angle was set to be 30° for the thick cylinder having a diameter of 6 cm, it was excited to a value of about 0.5. With the parameters set in this example, the error of the absolute value of the irradiation pattern was 9.7% according to the conventional method, and 9.6% according to the method of the present invention. Thus, a slightly more favorable result was obtained by the method of the present invention.

Figure 9:
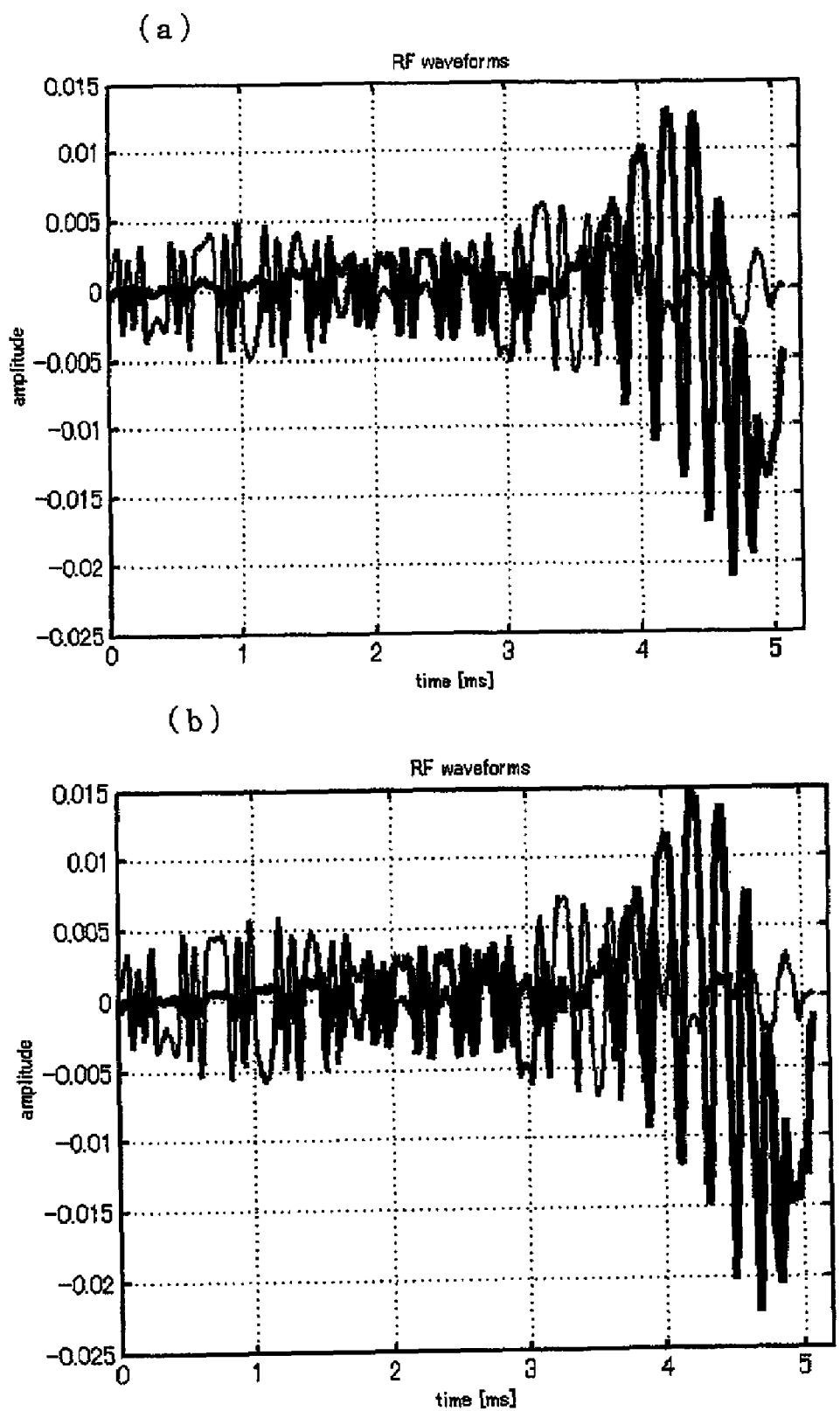
FIG. 9 (a) is an RF waveform for excitation in a shape of two cylinders according to the present invention, and (b) is an RF waveform for excitation in a shape of two cylinders according to the conventional method.

The real number components and imaginary number components of the RF waveforms calculated by the method of the present invention and the conventional method are shown in FIGS. 9, (a) and (b), respectively. The horizontal axes represent time [ms]. The scales of the vertical axes in (a) and (b) are the same. As seen from the results shown in FIGS. 9, (a) and (b), the magnitude of the RF waveform is smaller in the result obtained according to the present invention shown in (a). Based on the value of SAR provided by a rectangular 180° RF waveform of the same time length, which is taken as 1, the value of SAR was 0.141 according to the conventional method and 0.112 according to the method of the present invention, and thus it was found that SAR was reduced by about 21% according to the present invention.

Figure 10:
FIG. 10 (a) is a contour map of phase profile for excitation in a shape of two cylinders according to the present invention, and (b) is a contour map of phase profile for excitation in a shape of two cylinders according to the conventional method.
Figure 10:
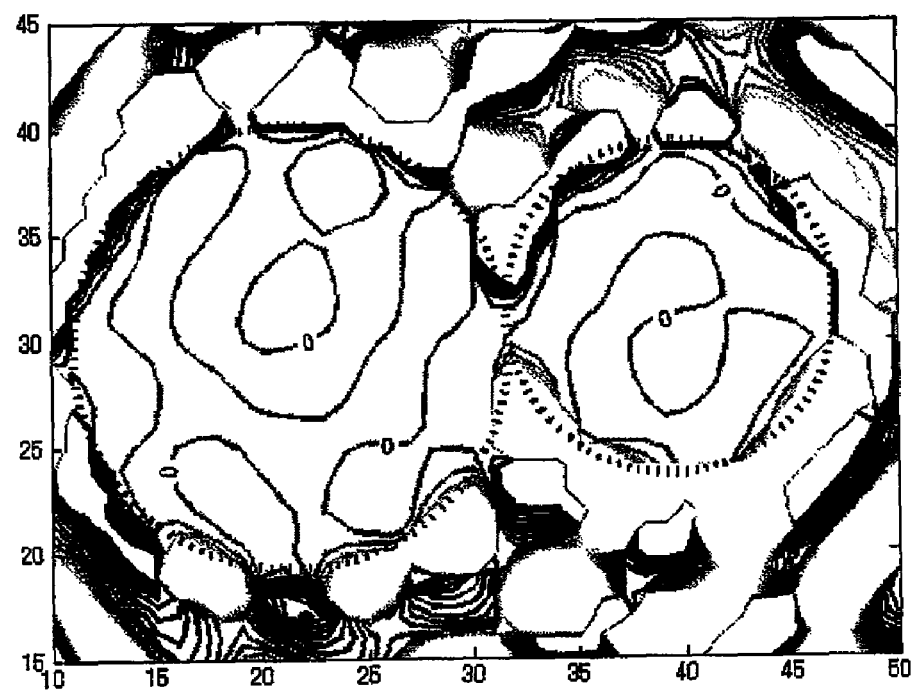

The phase components of the irradiation patterns according to the method of the present invention and the conventional method are shown with contour lines in FIGS. 10, (a) and (b), respectively. The contour lines are drawn with an interval of 0.05 radian. It can be seen that the phase in the two cylinders was in the range of 0±0.05 radian according to the conventional method as shown in (b), whereas the phase shows peaks and valleys in the range of 0±0.1 radian according to the method of the present invention. It can be seen that more significant reduction of SAR was realized according to the present invention compared with the conventional method by increasing error of the phase component of irradiation pattern, which does not affect the absolute value image.

INDUSTRIAL APPLICABILITY

According to the present invention, there is provided a method in which, in the minimization routine for calculating RF waveform so as to realize a profile having an ideal complex component, error of phase component with respect to an ideal profile and magnitude of RF waveform power can be made in a trade-off relation to each other.

This method can be used for constituting a part of MRI system, and is also applicable to, more generally, all the instruments in which radiation RF coil and irradiation pattern have critical meanings, for example, microwave ovens, cellular phone base stations, electromagnetic field analysis systems, and so forth.

The invention claimed is:

1. A magnetic resonance imaging apparatus comprising
   an irradiating means for irradiating magnetic field pulses comprising a gradient magnetic field and a radio frequency pulse on a test subject,
   a non-transitory waveform controlling means for calculating a radio frequency pulse waveform for realizing an ideal spatial irradiation pattern and applying a radio frequency pulse of the calculated waveform to the irradiating means, and
   an imaging means for processing nuclear magnetic resonance signals generated by the test subject upon irradiation of the magnetic field pulses to perform imaging, wherein:
   the non-transitory waveform controlling means comprises:
   a first memory means which memorizes multiple radio frequency pulse waveform vectors, and
   a calculating means for reading out a radio frequency pulse waveform vector from the memory means to calculate a simulated irradiation pattern and calculating a radio frequency pulse waveform which gives a minimum weighted sum of squares of differences of absolute values and squares of differences of phases between the ideal spatial irradiation pattern and the simulated irradiation pattern according to $$\min_x \left\{ \begin{array}{l} \lambda \sum_i \{|m_i| - |f_i(x)|\}^2 + \\ \chi \sum_i \{\angle m_i - \angle\{f_i(x)\}\}^2 + (1-\lambda-\chi)\|x\|_2^2 \end{array} \right\}. \quad (1)$$

where the radio frequency pulse waveform is represented by x, the ideal spatial irradiation pattern is represented by m and the simulated irradiation pattern is represented by f(x), and $\lambda$, $\chi$ and $(1-\lambda-\chi)$ are weighting parameters.

2. The magnetic resonance imaging apparatus according to claim 1, wherein:

the first memory means memorizes multiple imaging sequences and radio frequency pulse waveforms corresponding to the imaging sequences.

3. The magnetic resonance imaging apparatus according to claim 1, wherein:
the first memory means memorizes radio frequency pulse waveform vectors of time sampling dimension as the radio frequency pulse waveform vectors.

4. The magnetic resonance imaging apparatus according to claim 1, wherein:
the waveform controlling means comprises a second memory means which memorizes multiple ideal irradiation patterns, and the second memory means memorizes irradiation pattern vectors of space sampling dimension as the ideal irradiation patterns.

5. The magnetic resonance imaging apparatus according to claim 1, wherein:
the waveform controlling means comprises a data input/output means for receiving a shape and space sample points of the ideal irradiation pattern, and produces vectors of space sampling dimension from the shape and space sampling points of the ideal irradiation pattern received by the data input/output means.

6. The magnetic resonance imaging apparatus according to claim 1, wherein:
the calculating means calculates a radio frequency pulse waveform which gives a minimum weighted sum of squares of differences of absolute values and squares of differences of phases between the ideal irradiation pattern and the simulated irradiation pattern, and length of the radio frequency pulse.

7. The magnetic resonance imaging apparatus according to claim 1, wherein:
the radiation means comprises a radio frequency coil for transmitting a radio frequency pulse,
the waveform controlling means comprises a third memory means which memorizes matrix information determined by sensitivity map of the radio frequency coil and sweeping pattern of the gradient magnetic field, and the calculating means calculates the simulated irradiation pattern by using the matrix information read out from the third memory means and the radio frequency pulse waveform vectors.

8. The magnetic resonance imaging apparatus according to claim 1, wherein:
the irradiating means comprises multiple radio frequency coils, and
the waveform controlling means calculates the radio frequency pulse waveform vector for each of the multiple radio frequency coils.

9. The magnetic resonance imaging apparatus according to claim 1, wherein $\chi$ is $1/100$ to $1/10000$ of $\lambda$.

10. The magnetic resonance imaging apparatus according to claim 1, wherein:
the magnetic pulse comprises a radio frequency pulse and a gradient magnetic field which is applied simultaneously with the radio frequency pulse and sweeps a three-dimensional k-space, and the irradiation pattern is a three-dimensional space excitation pattern.

11. A method for calculating a pulse waveform x of a radio frequency pulse which gives an ideal spatial irradiation pattern m for a magnetic resonance imaging apparatus having irradiating means for irradiating magnetic field pulses comprising a gradient magnetic field and a radio frequency pulse on a test subject, which comprises:
the step of setting an irradiation pattern vector m of an arbitrary space sampling dimension (vector elements: $m_1, m_2, \ldots m_i, \ldots$);
the step of giving an initial value of the radio frequency pulse vector of time sampling dimension;
the step of calculating simulated irradiation pattern vector f(x) (vector elements: $f_1, f_2, \ldots f_i, \ldots$) of the same space sampling number as that of the irradiation pattern from the initial value of the radio frequency pulse vector;
the step of calculating a radio frequency pulse waveform x which satisfies the equation (1) for the ideal spatial irradiation pattern m and the simulated irradiation pattern f(x), $$\min_x \left\{ \lambda \sum_i \{|m_i| - |f_i(x)|\}^2 + x \sum_i \{\angle m_i - \angle\{f_i(x)\}\}^2 + (1 - \lambda - x)\|x\|_2^2 \right\} \quad (1)$$

wherein $\lambda$, $\chi$ and $(1-\lambda-\chi)$ represent parameters which determine weights of the vector elements as in equation 1;
applying the calculated radio frequency pulse waveform x to the irradiating means of the magnetic resonance imaging apparatus and
obtaining the desired ideal spatial irradiation pattern m from the means for irradiating magnetic field pulses of the magnetic resonance imaging apparatus.

12. The pulse waveform calculation method according to claim 11, wherein $\chi$ is $1/100$ to $1/10000$ of $\lambda$.

* * * * *